(12) United States Patent
Chen et al.

(10) Patent No.: US 11,577,491 B2
(45) Date of Patent: Feb. 14, 2023

(54) METALLIC LUSTROUS MEMBER WITH RADIO WAVE TRANSMISSIBILITY, ARTICLE USING SAME, AND PRODUCTION METHOD THEREFOR

(71) Applicant: NITTO DENKO CORPORATION, Baraki (JP)

(72) Inventors: Xiaolei Chen, Baraki (JP); Hironobu Machinaga, Baraki (JP); Hajime Nishio, Baraki (JP); Taichi Watanabe, Baraki (JP); Takahiro Nakai, Baraki (JP)

(73) Assignee: NITTO DENKO CORPORATION, Ibaraki (JP)

(*) Notice: Subject to any disclaimer, the term of this patent is extended or adjusted under 35 U.S.C. 154(b) by 66 days.

(21) Appl. No.: 16/961,741

(22) PCT Filed: Jan. 11, 2019

(86) PCT No.: PCT/JP2019/000694
§ 371 (c)(1),
(2) Date: Jul. 13, 2020

(87) PCT Pub. No.: WO2019/139122
PCT Pub. Date: Jul. 18, 2019

(65) Prior Publication Data
US 2021/0060904 A1 Mar. 4, 2021

(30) Foreign Application Priority Data

Jan. 12, 2018 (JP) .............................. JP2018-003620
Jan. 10, 2019 (JP) .............................. JP2019-002727

(51) Int. Cl.
*B32B 15/20* (2006.01)
*B32B 3/14* (2006.01)
(Continued)

(52) U.S. Cl.
CPC ............... *B32B 15/20* (2013.01); *B32B 3/14* (2013.01); *B32B 15/09* (2013.01); *B32B 17/061* (2013.01);
(Continued)

(58) Field of Classification Search
None
See application file for complete search history.

(56) References Cited

U.S. PATENT DOCUMENTS 11,383,478 B2 * 7/2022 Nishio ................... B32B 9/00
2007/0098967 A1 5/2007 Ido et al.
(Continued)

FOREIGN PATENT DOCUMENTS

JP 2007-138270 A 6/2007
JP 2007-144988 A 6/2007
(Continued)

OTHER PUBLICATIONS

Kondo—JP 2011-180562 A—ISR D2+Euro D2—MT—Resin—2011 (Year: 2011).*
(Continued)

*Primary Examiner* — John Vincent Lawler
(74) *Attorney, Agent, or Firm* — Hauptman Ham, LLP

(57) ABSTRACT

A metallic lustrous member with radio wave transmissibility is provided, which is capable of being easily produced, while ensuring a structure in which not only chromium or indium but also any of some other metals such as aluminum is formed as a metal layer on a continuous surface of any of various materials, and also an article using the member is provided. A production method for a metallic lustrous member with radio wave transmissibility, which is capable of easily forming, as a metal layer, not only chromium or indium but also any of some other metals such as aluminum, on a continuous surface of any of various materials. The (Continued)

metallic lustrous member comprises a substrate having radio wave transmissibility, and an aluminum layer formed directly on a continuous surface of the substrate. The aluminum layer has a discontinuous region including a plurality of separated segments which are mutually discontinuous.

12 Claims, 3 Drawing Sheets

(51) Int. Cl.
    *B32B 15/09*      (2006.01)
    *B32B 17/06*      (2006.01)
    *B32B 27/30*      (2006.01)
    *B32B 27/32*      (2006.01)
    *B32B 27/36*      (2006.01)
    *C23C 14/08*      (2006.01)
    *C23C 14/14*      (2006.01)

(52) U.S. Cl.
    CPC ............ *B32B 27/308* (2013.01); *B32B 27/32* (2013.01); *B32B 27/365* (2013.01); *C23C 14/086* (2013.01); *C23C 14/14* (2013.01); *B32B 2250/02* (2013.01); *B32B 2250/03* (2013.01); *B32B 2250/44* (2013.01); *B32B 2307/70* (2013.01); *B32B 2311/24* (2013.01); *B32B 2315/08* (2013.01); *B32B 2323/00* (2013.01); *B32B 2367/00* (2013.01); *B32B 2369/00* (2013.01); *C03C 2217/252* (2013.01); *C03C 2217/27* (2013.01)

(56) References Cited

U.S. PATENT DOCUMENTS

| | | | |
|---|---|---|---|
| 2007/0117380 A1* | 5/2007 | Ido | H01Q 1/3233<br>438/653 |
| 2009/0297880 A1* | 12/2009 | Maruoka | C23C 14/0015<br>428/209 |
| 2010/0207842 A1 | 8/2010 | Kawaguchi et al. | |
| 2015/0293025 A1* | 10/2015 | Ninomiya | C23C 14/5813<br>428/209 |
| 2018/0090832 A1 | 3/2018 | Takahashi et al. | |
| 2019/0275759 A1 | 9/2019 | Nishio et al. | |

FOREIGN PATENT DOCUMENTS

| | | | | |
|---|---|---|---|---|
| JP | 2009-298006 A | | 12/2009 | |
| JP | 2010-251899 A | | 11/2010 | |
| JP | 2010251899 | * | 11/2010 | ............ B32B 15/08 |
| JP | 2011/180562 | * | 9/2011 | ............ B32B 15/08 |
| JP | 2011-180562 A | | 9/2011 | |
| JP | 2018-56683 A | | 4/2018 | |
| JP | 2018192808 | * | 12/2018 | ............ B32B 15/04 |
| WO | 2009/038116 A1 | | 3/2009 | |
| WO | 2011090010 A1 | | 7/2011 | |
| WO | 2011099447 A1 | | 8/2011 | |
| WO | WO 2015/025963 | * | 3/2017 | ............ B32B 15/04 |
| WO | 2018/079547 A1 | | 5/2018 | |

OTHER PUBLICATIONS

Miyako—JPWO 2015-025963 A1—Rej.'754—MT—discontinuous layer w—indium oxide in adhesive—2015 (Year: 2015).*

Honma—JP 2010-251899 A—IDS—MT—composite w—electromagnetic wave transparency—2010 (Year: 2010).*

Nishio—JP 2018192808 A—MT—lustrous member—overlap inventors—2018 (Year: 2018).*

International Search Report dated Mar. 5, 2019 for corresponding international application No. PCT/JP2019/000694.

Written Opinion issued for corresponding International Patent Application No. PCT/JP2019/000694 dated May 3, 2019.

The Extended European Search Report issued for corresponding European Patent Application No. 19738662.6 dated Sep. 23, 2021.

Office Action dated Oct. 3, 2022, for corresponding Japanese patent application No. 2019-002727, along with an English machine translation (14 pages).

Office Action/Search Report dated May 5, 2022, for corresponding Chinese patent application No. 201980007970.5, along with an English machine translation.

* cited by examiner

METALLIC LUSTROUS MEMBER WITH RADIO WAVE TRANSMISSIBILITY, ARTICLE USING SAME, AND PRODUCTION METHOD THEREFOR

CROSS-REFERENCE TO RELATED APPLICATION

This application is a US National Stage of International Application No. PCT/JP2019/000694, filed on Jan. 11, 2019, which is based upon and claims the benefit of priorities to Patent Application No. 2018-003620, filed on Jan. 12, 2018 in Japan, and Patent Application No. 2019-002727, filed on Jan. 10, 2019 in Japan. All of the aforementioned applications are hereby incorporated by reference herein in their entireties.

TECHNICAL FIELD

The present invention relates to a metallic lustrous member with radio wave transmissibility, an article using the member, and a production method for the member or the article.

BACKGROUND ART

A metallic lustrous member having both lustrousness and radio wave transmissibility (permeability) is needed, for example, to decorate a cover member of a millimeter-wave radar mounted to a front component such as a front grille or an emblem at a front end of an automotive vehicle.

The millimeter-wave radar is configured to transmit an electromagnetic wave having a millimeter waveband (frequency: about 77 GHz, wavelength: about 4 mm) forwardly with respect to the vehicle, and receive and analyze a reflected wave from a target so as to measure a distance or a direction with respect to the target, or the size of the target. A result of the measurement can be utilized for inter-vehicle distance measurement, automatic vehicle speed adjustment, automatic brake adjustment, etc. The front component of the vehicle to which the millimeter-wave radar is mounted is a portion constituting, so to say, the face of the vehicle, and giving a profound impression on a user. Thus, it is preferable to create a high-class appearance or the like by a metallic lustrous front decoration. However, if the front component of the vehicle is made of a metal material, it will substantially preclude or hinder the millimeter-wave radar from emitting and receiving an electromagnetic wave. Therefore, in order to prevent hindering of the function of the millimeter-wave radar without spoiling an aesthetic appearance of the vehicle, there is a need for a metallic lustrous member having both lustrousness and radio wave transmissibility.

In addition to application to millimeter-wave radars, this type of metallic lustrous member is expected to be applied to various other devices requiring signal transmitting-receiving, e.g., a door handle module of an automotive vehicle using a smart key system, in-vehicle communication devices, and electronic devices such as a mobile phone and a personal computer. Further, in recent years, along with development in IoT technologies, the metallic lustrous member is also expected to be applied to a wide range of fields, e.g., home or daily-life appliances such as a refrigerator, in which signal transmitting-receiving has heretofore not been performed.

With regard to the metallic lustrous member, in JP 2007-144988A (Patent Document 1), there is disclosed a resin product comprising a metal coating or film made of chromium (Cr) or indium (In). This resin product comprises: a resin substrate; an inorganic underlying film (inorganic undercoating) containing an inorganic compound and formed on the resin substrate; and the metal film made of chromium (Cr) or indium (In), wherein the metal film is formed on the inorganic underlying film by a physical vapor deposition process to have a lustrous and discontinuous structure. In the Patent Document 1, the inorganic underlying film is composed of (a) a thin film of a metal compound such as: a titanium compound including titanium oxide (TiO, $TiO_2$, $Ti_3O_5$, etc.); a silicon compound including silicon oxide (SiO, $SiO_2$, etc.) or silicon nitride ($Si_3N_4$, etc.); an aluminum compound including aluminum oxide ($Al_2O_3$); an iron compound including iron oxide ($Fe_2O_3$); a selenium compound including selenium oxide (CeO); a zircon compound including zircon oxide (ZrO); or a zinc compound including zinc sulfide (ZnS), or (b) a coating film made of an inorganic coating material, e.g., a coating film made of an inorganic coating material comprising a primary component consisting of silicon, amorphous $TiO_2$ or the like (additionally, any of the metal compounds exemplified above). However, this resin product is based on the assumption of using only chromium (Cr) or indium (In) as a material for the metal film. In other words, a metal superior to chromium and indium in terms of cost and lustrousness, such as aluminum (Al), cannot be used as a material for the metal film.

Further, in JP 2009-298006A (Patent Document 2), there is disclosed a lustrous resin product with electromagnetic wave transmissibility, comprising a metal film which may be formed of not only chromium (Cr) or indium (In) but also aluminum (Al), silver (Ag) or nickel (Ni). In the Patent Document 2, an underlying film having a discontinuous structure is provided, and then the metal film is formed on each of a plurality of discontinuous portions of the underlying film. However, due to restrictions, such as a requirement that an inclination angle of a substrate during sputtering must be set to 0° or 70° to form the underlying film in a discontinuous layer, there is a problem of complexity in production process. Further, in the Patent Document 2, it is impossible to form the metal film, using zinc (Zn), lead (Pb) or copper (Cu), or an alloy thereof.

CITATION LIST

Parent Document

Patent Document 1: JP 2007-144988A
Patent Document 2: JP2009-298006A

SUMMARY OF INVENTION

Technical Problem

The present invention has been made to solve the above conventional problems, and an object thereof is to provide a metallic lustrous member with radio wave transmissibility, which is capable of being easily produced, wherein not only chromium (Cr) or indium (In) but also any of some other metals such as aluminum (Al) is formed as a metal layer on a continuous surface of any of various materials, and an article using the member. It is another object of the present invention to provide a production method for a metallic lustrous member with radio wave transmissibility, or an article using the member, which is capable of easily forming, as a metal layer, not only chromium (Cr) or indium (In) but also any of some other metals such as aluminum (Al), on a continuous surface of any of various materials.

Solution to Technical Problem

As a result of diligent studies for solving the above problems, the present inventors found that, by using AC (alternating current) sputtering, it becomes possible to cause a metal which normally has difficulty in being formed into a discontinuous structure, such as aluminum (Al), to develop a discontinuous structure on a continuous surface of any of various materials, and have reached accomplishment of the present invention.

In order to solve the above problems, according to a first aspect of the present invention, there is provided a metallic lustrous member with radio wave transmissibility, which comprises: a substrate having radio wave transmissibility; and an aluminum layer formed directly on a continuous surface of the substrate, wherein the aluminum layer has a discontinuous region including a plurality of separated segments which are mutually discontinuous.

The metallic lustrous member according to the first aspect of the present invention is capable of being easily produced, while ensuring a structure in which not only chromium (Cr) or indium (In) but also any of some other metals such as aluminum (Al) is formed as a metal layer on a continuous surface of any of various materials.

Preferably, in the metallic lustrous member according to the first aspect of the present invention, the aluminum layer has a sheet resistance of 90Ω/□ or more.

In order to solve the above problems, according to a second aspect of the present invention, there is provided a metallic lustrous member with radio wave transmissibility, which comprises: a substrate having radio wave transmissibility; and an aluminum layer formed directly on a continuous surface of the substrate, wherein the member has a sheet resistance of 90Ω/□ or more.

The metallic lustrous member according to the second aspect of the present invention is capable of being easily produced, while ensuring a structure in which not only chromium (Cr) or indium (In) but also any of some other metals such as aluminum (Al) is formed as a metal layer on a continuous surface of any of various materials.

In the metallic lustrous member according to the first or second aspect of the present invention, the continuous surface may be formed of a dielectric resin material or a glass material. Here, the dielectric resin material may be comprised of any one of polyester, polyolefin, acrylic-based polymer, and polycarbonate.

In the metallic lustrous member according to the first or second aspect of the present invention, the continuous surface may be formed using an indium oxide-containing material.

In the metallic lustrous member according to the first or second aspect of the present invention, the substrate may be one selected from the group consisting of a film, a resin molded product, a glass product, and an article itself to be imparted with metallic luster.

Preferably, in the metallic lustrous member according to the first or second aspect of the present invention, the aluminum layer has a maximum thickness of 15 to 80 nm.

Preferably, in the metallic lustrous member according to the first or second aspect of the present invention, the aluminum layer has a radio wave transmission attenuation amount of 10 dB or less.

In the metallic lustrous member according to the first or second aspect of the present invention, the aluminum layer may be one of aluminum (Al) and an aluminum (Al) alloy. Here, a content ratio of aluminum to an entire metal component in the aluminum (Al) alloy is preferably 50% or more.

In the metallic lustrous member according to the first or second aspect of the present invention, the aluminum layer may be provided on an inner surface of a transparent housing formed using the continuous surface of the substrate.

According to a third aspect of the present invention, there is provided a production method for a metallic lustrous member with radio wave transmissibility, or an article using the member. The production method comprises the step of forming an aluminum layer directly on a substrate having radio wave transmissibility by means of AC sputtering, wherein the aluminum layer has a discontinuous region including a plurality of separated segments which are mutually discontinuous.

According to a fourth aspect of the present invention, there is provided a production method for a metallic lustrous member with radio wave transmissibility, or an article using the member. The production method comprises the step of forming an aluminum layer directly on a substrate having radio wave transmissibility by means of AC sputtering, such that the aluminum layer has a sheet resistance of 90Ω/□ or more The production method according to the third or fourth aspect of the present invention makes it possible to easily form, as a metal layer, not only chromium (Cr) or indium (In) but also any of some other metals such as aluminum (Al), on a continuous surface of any of various materials.

In the production method according to the third or fourth aspect of the present invention, the aluminum layer may be formed directly on a continuous surface of the substrate. Here, the continuous surface may be formed of a dielectric resin material or a glass material, or may be formed using an indium oxide-containing material.

Preferably, in the production method according to the third or fourth aspect of the present invention, the AC sputtering is performed under a pressure of 1.5 Pa or more.

Preferably, in the production method according to the third or fourth aspect of the present invention, during the AC sputtering, the substrate has a temperature of 20° C. or more.

Effect of Invention

The present invention provides: a metallic lustrous member with radio wave transmissibility, which is capable of being easily produced, wherein a surface on which a metal layer is to be formed may be a continuous surface, and not only chromium (Cr) or indium (In) but also any of some other metals such as aluminum (Al) is usable as the metal layer; an article using the member; and a production method therefor.

DESCRIPTION OF EMBODIMENTS

With reference to the accompanying drawings, a preferred embodiment of the present invention will now be described. Although only the preferred embodiment of the present invention will be shown in the following for the sake of convenience of explanation, it should be understood that the present invention is not limited thereto.

1. BASIC CONFIGURATION

Figure 1A:
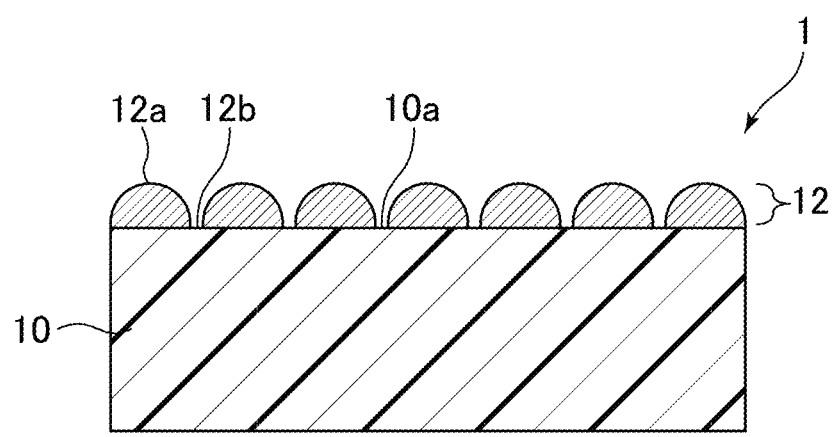
FIGS. 1A and 1B are schematic sectional views each showing a metallic lustrous member with radio wave transmissibility according to a respective one of two embodiments of the present invention.
Figure 1B:
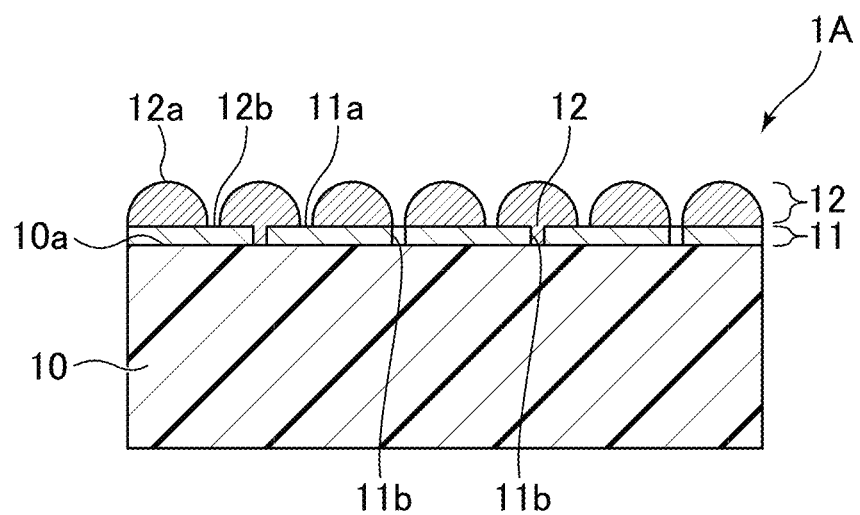

FIGS. 1A and 1B are schematic sectional views each showing metallic lustrous member with radio wave transmissibility (hereinafter referred to as "metallic lustrous member") (1, 1A) according to a respective one of two embodiments of the present invention. In these figures and other figures, the same or corresponding elements or members are assigned with the same reference sign.

Each of the metallic lustrous members 1, 1A comprises: a substrate 10 having radio wave transmissivity; and a metal layer 12 formed directly on a continuous surface (10a, 11a) of the substrate 10. A difference between the metallic lustrous member 1 and the metallic lustrous member 1A resides in that, in the metallic lustrous member 1A, an underlying layer 11 is provided on the substrate 10, which is different from the metallic lustrous member 1. The underlying layer 11 is provided to reduce a wettability between the metal layer 12 and the substrate 10, and, by providing the underlying layer 11, the metal layer 12 is more likely to become discontinuous. The underlying layer 11 is provided in the metallic lustrous member 1A, so that, differently from the continuous surface 10a in the metallic lustrous member 1, the continuous surface 11a in the metallic lustrous member 1A is not formed by the surface 10a of the substrate 10 itself, but instead formed, exactly, by the surface 11a of the underlying layer 11 provided on the substrate 10. This underlying layer 11 is a thin film-shaped layer, and therefore there is a possibility that a discontinuous portion 11b could be formed. However, even if such a discontinuous portion 11b is formed, the metal layer 12 never becomes discontinuous due to the discontinuous portion 11b, because the underlying layer 11 has a thickness as small as about 10 nm or less. In other words, even supposing that there is the discontinuous portion 11b in the underlying layer 11, it can be understood that, with regard to a relationship with the metal layer 12, the substrate 10 substantially forms the continuous surface 11a, although it includes such an underlying layer 11. Therefore, the wording "continuous surface of the substrate" in the specification encompasses not only the continuous surface 10a of the substrate itself but also the continuous surface 11a of the substrate including the underlying layer. As above, for both of the metallic lustrous members 1 and 1A, the metal layer 12 is directly formed on the continuous surface (10a, 11a) of the substrate 10, so that it is possible to significantly improve smoothness and corrosion resistance thereof, and facilitate disposing the metal layer 12 without any in-plane variation.

2. SUBSTRATE

<2-1. Article Composing Substrate>

The substrate 10 is required to have radio wave transmissivity, and may be, e.g., a film, a resin molded product, a glass product, or an article (body) itself to be imparted with metallic luster.

In a case where the substrate 10 is a film, the film is formed of a material including a homopolymer or copolymer of polyethylene terephthalate (PET), polyethylene naphthalate (PEN), polybutylene terephthalate, polyamide, polyimide, nylon, polyvinyl chloride, polycarbonate (PC), cycloolefin polymer (COP), polystyrene, polypropylene (PP), polyethylene (PE), polycycloolefin, polyurethane, polymethylmethacrylate (PMMA), or ABS. These materials have no influence on lustrousness and radio wave transmissibility. Preferably, the film is transparent. Further, from a viewpoint of subsequently forming the metal layer 12 thereon, it is desirable that the film is capable of withstanding high temperatures during sputtering.

Thus, among the above materials, e.g., polyethylene terephthalate, polyethylene naphthalate, polycarbonate, cycloolefin polymer, polypropylene, polyurethane, polymethylmethacrylate, and ABS, are preferable. Among them, polyethylene terephthalate, cycloolefin polymer, polycarbonate and polymethylmethacrylate are particularly preferable, because they have a good balance between heat resistance and cost. The substrate 10 may be a single-layer film or may be a laminate film. From a viewpoint of easy processing etc., the thickness thereof is preferably, e.g., from about 6 to 250 μm.

In a case where the substrate 10 is a glass product, it is possible to use, e.g., a soda-lime glass, an alkali-free glass, and a chemically strengthened glass. However, a material for the glass product is not limited thereto.

In a case where the substrate 10 is a resin molded product, it is possible to use, e.g., ABS, PC, PMMA, PP, PE, polyphthalamide (PPA), polyoxymethylene (POM), and polybutylene terephthalate (PBT). However, a material for the resin molded product is not limited thereto.

A case where the substrate 10 is an article itself to be imparted with metallic luster, is, for example, a case where the substrate 10 is used to form an emblem of an automotive vehicle, a body of a door knob of an automotive vehicle using a smart key system, a housing (outer casing) of a communication device such as a mobile phone or a personal computer, or a housing of refrigerator. In a case where the housing of a communication device or the like is transparent, the metal layer 12 may be provided on an outer surface of the housing, or may be provided on an inner surface of the housing. However, an article (body) to be imparted with metallic luster preferably has a similar material to that of or satisfies similar requirements to those of the above film, glass product or resin molded product.

<2-2. Continuous Surface of Substrate>

The continuous surface 10a of the substrate 10 may be formed of, e.g., a dielectric resin material, or a glass material. On the other hand, the continuous surface 10b of the substrate 10 may be formed of, e.g., one of a dielectric resin material, a glass material, and an indium oxide-containing material. The continuous surface 10a or 11a needs not necessarily be entirely formed of one of the above materials, but a specific part and the remaining part thereof may be formed of different ones of the above materials, respectively. Further, the continuous surface 10a or 11a may be only partly formed of one of the above materials.

As the dielectric resin material, it is possible to use, e.g., polyester, polyolefin, acrylic-based polymer, and polycarbonate. The dielectric resin material includes a material obtained by forming a dielectric metal oxide material such as $Al_2O_3$, $SiO_2$, $Nb_2O_3$, or $TiO_2$, or a dielectric metal nitride material such as MN or SiN, on a resin molded product such as a film. For example, as shown in FIG. 1A, when the substrate 10 is the resin molded product, the continuous surface 10a of the substrate 10 may be formed of a material of the resin molded product. In this case, the continuous surface 10a can be formed by the article itself to be imparted with metallic luster. In other words, the metal layer 12 can be formed directly on the substrate 10.

As the glass material, it is possible to use, e.g., alkali-free glass. For example, as shown in FIG. 1A, when the substrate 10 is the glass product, the continuous surface 10a of the substrate 10 may be formed of a material of the glass product. In this case, the continuous surface 10a can be formed by the article itself to be imparted with metallic luster. In other words, the metal layer 12 can be formed directly on the substrate 10.

As the indium oxide-containing material, it is possible to use, e.g., indium oxide ($In_2O_3$) itself, or a metal-containing material such as indium tin oxide (JOT) or indium zinc oxide (IZO). However, ITO or IZO containing a second metal is more preferable, from a viewpoint of higher discharge stability in a sputtering process. The content rate by weight of tin (Sn) with respect to $In_2O_3$ in ITO is, e.g., but not particularly limited to, from 2.5 wt % to 30 wt %, preferably from 3 wt % to 10 wt %. Further, the content rate by weight of zinc oxide (ZnO) with respect to $In_2O_3$ in IZO is, e.g., from 2 wt % to 20 wt %. The indium oxide-containing material is provided as the underlying layer 11 to reduce a wettability between the metal layer 12 and the substrate 10, as shown in FIG. 1B. Thus, the indium oxide-containing material substantially can form the continuous surface 11a of the substrate 10. However, in the case where the continuous surface 11a of the substrate 10 is formed of the dielectric resin material, the continuous surface 11a cannot be formed by the article itself to be imparted with metallic luster. The indium oxide-containing material 11 as the underlying layer may be provided directly on the surface of the substrate 10, or may be provided in an indirect manner through a protective film provided on the surface of the substrate 10. From a viewpoint of sheet resistance, radio wave transmissibility and productivity, the thickness of the indium oxide-containing layer 11 is generally preferably 100 nm or less, more preferably 50 nm or less, still more preferably 20 nm or less. On the other hand, from a viewpoint of laminating the metal layer 12 in a discontinuous state, the thickness of the indium oxide-containing layer 11 is preferably 1 nm or more, and, from a viewpoint of reliably obtaining the discontinuous state, it is more preferably 2 nm or more, still more preferably 5 nm or more.

3. METAL LAYER

<3-1. Structure of Metal Layer>

The metal layer 12 is provided on the continuous surface 10a or 11a of the substrate 10 by means of AC sputtering such as MF-AC sputtering using an intermediate frequency range of, e.g., 40 KHz. By using the AC sputtering to provide the metal layer 12, it becomes possible to allow the metal layer 12 to be formed such that it has, on at least a part of the continuous surface 10a or 11a, a discontinuous region including a plurality of separated segments 12a which are mutually discontinuous, and, more specifically, separated from each other by interspaces 12b. Since the separated segments 12a are separated from each other by the interspaces 12b, a sheet resistance in the separated segments 12a is increased, and a radio wave transmission attenuation amount in the separated segments 12a is reduced, so that an interaction of the separated segments 12a with electromagnetic waves is weakened to allow electromagnetic waves to be transmitted through the metal layer 12. Each of the separated segments 12a is an aggregate of sputtered particles formed by subjecting a metal to the AC sputtering. Although details of a mechanism causing the metal layer 12 to become a discontinuous state on the continuous surface 10a or 11a is not exactly clear, it is inferred as follows. That is, in a thin film forming process for the metal layer 12, easiness in forming a discontinuous structure of the metal layer 12 is relevant to surface diffusibility of the metal layer 12 on a to-be-covered member (in this embodiment, the continuous surface 11a or 11a) to be covered with the metal layer 12. Specifically, the discontinuous structure is more likely to be formed under the condition that: the temperature of the to-be-covered member is higher; the wettability of the metal layer with respect to the to-be-covered member is smaller; and the melting point of the metal layer is lower. Therefore, with regard to some metals other than aluminum (Al) used particularly in the following Examples, such as zinc (Zn), lead (Pb), copper (Cu) and silver (Ag) each having a relatively low melting point, the discontinuous structure is considered to be able to be formed in a similar manner. It should be noted here that the term "discontinuous state" as used in this specification means a state in which the separated segments 12a are separated from each other by the interspaces 12b, and thereby electrically insulated from each other. As a result of the electrical insulation, the sheet resistance is increased, so that it becomes possible to obtain a desirable radio wave transmissibility. The configuration of the discontinuity is not particularly limited. For example, it may include an island-shaped configuration and a cracked configuration. Here, the term "island shape" means a structure in which particles each as an aggregate of sputtered particles are independent of each other, and laid on the continuous surface 11a in slightly spaced-apart relation to each other or in partially contact relation with each other, as shown in FIG. 1B.

<3-2. Material for Metal Layer>

The metal layer 12 is essentially capable of bringing out sufficient lustrousness. Further, it is desirable that the melting point thereof is relatively low. This is because the metal layer 12 is created through thin-film growth using sputtering. For this reason, a metal having a melting point of about 1000° C. or less is suitable as a material for the metal layer 12. For example, the metal layer 12 is preferably made of at least one metal selected from the group consisting of aluminum (Al), zinc (Zn), lead (Pb), copper (Cu) and silver (Ag), or any alloy comprising a primary component consisting of two or more of these metals. Particularly, Al and Al alloys are preferable for reason of lustrousness, stability, cost, etc., of a material. With regard to the aluminum alloy, the content rate of aluminum in the entire metal components of the alloy is preferably 50% or more, more preferably 60% or more, further preferably 75% or more.

<3-2-1. Case where Continuous Surface is Formed by Substrate Itself>

In the case where the continuous surface is formed by the surface 10a of the substrate 10 itself, and the metal layer 12 is formed directly on this continuous surface 10a, as shown in FIG. 1A, the thickness of the metal layer 12 is generally preferably 15 nm or more, so as to allow the metal layer 12 to bring out sufficient lustrousness, and generally preferably 80 nm or less, from a viewpoint of the sheet resistance and the radio wave transmissibility. For example, the thickness of the metal layer 12 is preferably from 20 nm to 75 nm, more preferably from 25 nm to 70 nm. This thickness is suited to forming a uniform film with good productivity, and provides good external appearance of a resin molded product as a final product.

Further, the sheet resistance of the metal layer 12 is preferably from 100 to 100,000Ω/□, so as to allow the metal layer 12 to bring out sufficient radio wave transmissibility. In this case, the radio wave transmissibility at a wavelength of 1 GHz is from about 10 to 0.01 [− dB]. More preferably, the sheet resistance is from 1,000 to 50,000 Ω/□.

<3-2-2. Case where Continuous Surface is Formed by Underlying Layer>

In the case where the continuous surface 11a is formed by the surface of the underlying layer 11, and the metal layer 12 is formed directly on this continuous surface 11a of the substrate 10, as shown in FIG. 1B, the thickness of the metal layer 12 is generally preferably 20 nm or more, so as to allow the metal layer 12 to bring out sufficient lustrousness, and generally preferably 100 nm or less, from the viewpoint of the sheet resistance and the radio wave transmissibility. For example, the thickness of the metal layer 12 is preferably from 20 nm to 100 nm, more preferably from 30 nm to 70 nm. As above, the preferable value is set to be larger than that in the sub-sub-section 3-2-1. This is because, as a result of providing the underlying layer 11, the wettability between the metal layer 12 and the substrate 10 is reduced, and thereby the metal layer 12 becomes more likely to be formed as a discontinuous layer, so that it is possible to increase the thickness of the metal layer 12. Here, the underlying layer 11 is a thin film-shaped layer, so that it exerts substantially no influence on the lustrousness, the sheet resistance, etc. This thickness is suited to forming a uniform film with good productivity, and provides good external appearance of a resin molded product as a final product.

Further, for the similar reasons, in a case where the underlying layer 11 is, e.g., an indium oxide-containing layer, the ratio of the thickness of the metal layer to the thickness of the indium oxide-containing layer (the thickness of the metal layer/the thickness of the indium oxide-containing layer) is preferably from 0.1 to 100, preferably from 0.3 to 35.

Further, a laminate of the metal layer 12 and the underlying layer 11 preferably has a sheet resistance of 100 to 100,000Ω/□. In this case, the radio wave transmission attenuation amount of the laminate at a wavelength of 1 GHz is from about 10 to 0.01 [− dB]. More preferably, the radio wave transmission attenuation amount is from 1,000 to 50,000 Ω/□.

4. PRODUCTION METHOD FOR METALLIC LUSTROUS MEMBER

One example of a production method for each of the metallic lustrous members 1, 1A will be described.

<4-1. Case where Continuous Surface is Formed by Substrate Itself>

In the case where the continuous surface 10a is formed by the surface of the substrate 10 itself, and the metal layer 12 is formed directly on this continuous surface 10a, as shown in FIG. 1A, the metal layer 12 is laminated directly onto the continuous surface 10a by means of the AC sputtering, without going through a step of forming the continuous surface 10a.

<4-2. Case where Continuous Surface is Formed by Underlying Layer>

In the case where the continuous surface 11a is formed by the surface of the underlying layer 11, and the metal layer 12 is formed directly on this continuous surface 11a, as shown in FIG. 1B, at least two steps are needed.

(1) Step of Forming Indium Oxide-Containing Layer

The indium oxide-containing layer 11 is formed onto the substrate 10. The indium oxide-containing layer 11 can be formed by vacuum deposition (vacuum vapor deposition), sputtering, ion plating or the like. Among them, sputtering is preferable, from a viewpoint of being capable of strictly controlling the thickness of the indium oxide-containing layer 11 even when it has a relatively large area.

(2) Step of Laminating Metal Layer

Subsequently, the metal later 12 is laminated directly onto the continuous surface 11a formed by the indium oxide-containing layer 11. The AC sputtering is used for laminating the metal layer 12. Preferably, the metal layer 12 is laminated such that it comes into direct contact with the indium oxide-containing layer 11 without interposing any additional layer therebetween. However, as long as the above mechanism based on surface diffusibility of the metal layer 12 on the indium oxide-containing layer 11 effectively functions, an additional layer may be interposed therebetween.

5. INVENTIVE EXAMPLES AND COMPARATIVE EXAMPLES

<5-1. Case where Continuous Surface is Formed by Substrate Itself>

In Inventive and Comparative Examples, various samples were prepared by using a film as the substrate 10. Each of the prepared samples was evaluated in terms of sheet resistance, radio wave transmission attenuation amount, and gloss value. The sheet resistance and the radio wave transmission attenuation amount are evaluation indexes of the radio wave transmissibility, and the gloss value is an evaluation index of the lustrousness. A larger value of each of the gloss value and the sheet resistance is more desirable, and a smaller value of the radio wave transmission attenuation amount is more desirable.

Details of evaluation methods are as follows.

(1) Sheet Resistance

The sheet resistance of the metal layer was measured by an eddy-current measurement method in accordance with JIS-Z2316, using a non-contact type resistance measuring device NC-80MAP manufactured by Napson Corporation. This sheet resistance needs to be equal to or greater than 90Ω/□ (ohms per square), wherein it is preferably equal to or greater than 200Ω/□, more preferably equal to or greater than 250Ω/□, further preferably equal to or greater than 600Ω/□. If the sheet resistance is less than 90Ω/□, there is a problem that a sufficient radio wave transmissibility cannot be obtained.

(2) Radio Wave Transmission Attenuation Amount

A radio wave transmission attenuation amount at 1 GHz was evaluated using a KEC method measurement and evaluation jig, and a spectral analyzer CXA signal Analyzer NA9000A manufactured by Agilent technologies Inc. An electromagnetic wave transmissibility in a frequency band (76 to 80 GHz) of a millimeter-wave radar is correlated with an electromagnetic wave transmissibility in a microwave band (1 GHz), and thus they exhibit relatively close values. Thus, in this evaluation, the radio wave transmissibility in the microwave band (1 GHz), i.e., microwave electric field transmission attenuation amount, was used as an index.

This microwave electric field transmission attenuation amount be equal to or less than 10 [− dB], wherein it is preferably equal to or less than 5 [− dB], more preferably equal to or less than 2 [− dB]. If the microwave electric field transmission attenuation amount is greater than 10 [− dB], there is a problem that 90% or more of a radio wave is shielded.

(3) Gloss Value

A 20-degree specular gloss value (degree of luster) of the metal layer was measured in accordance with JIS-Z8741, using a glossmeter PG-II M manufactured by Nippon Denshoku Industries Co. The gloss value has a correlation with a visible light reflectance used in the following sub-section 5-2, and thus they can be deemed to be substantially the same evaluation index. However, the gloss value, which is excellent in quantitative representation of metallic luster, was used.

In order to have sufficient lustrousness, the gloss value needs to be equal to or greater than 500, wherein it is preferably equal to or greater than 750, more preferably, equal to or greater than 1000. If the gloss value is less than 500, there is a problem that the lustrousness significantly deteriorates, resulting in failing to ensure excellent external appearance.

(4) Thickness of Metal Layer

In Inventive and Comparative Examples, considering variation in thickness of the metal layer, more specifically, variation in thickness between the separated segments $12a$ illustrated in FIG. 1, an average of the thicknesses of the separated segments $12a$ is defined as the thickness of the metal layer. This average will hereinafter be referred to as "maximum thickness", for the sake of simplicity. Here, the thickness of each of the separated segments $12a$ is defined as the largest thickness thereof as measured perpendicularly from a base (which corresponds to the continuous surface $10a$ or $11a$ in FIGS. 1A and 1B).

Figure 2A:
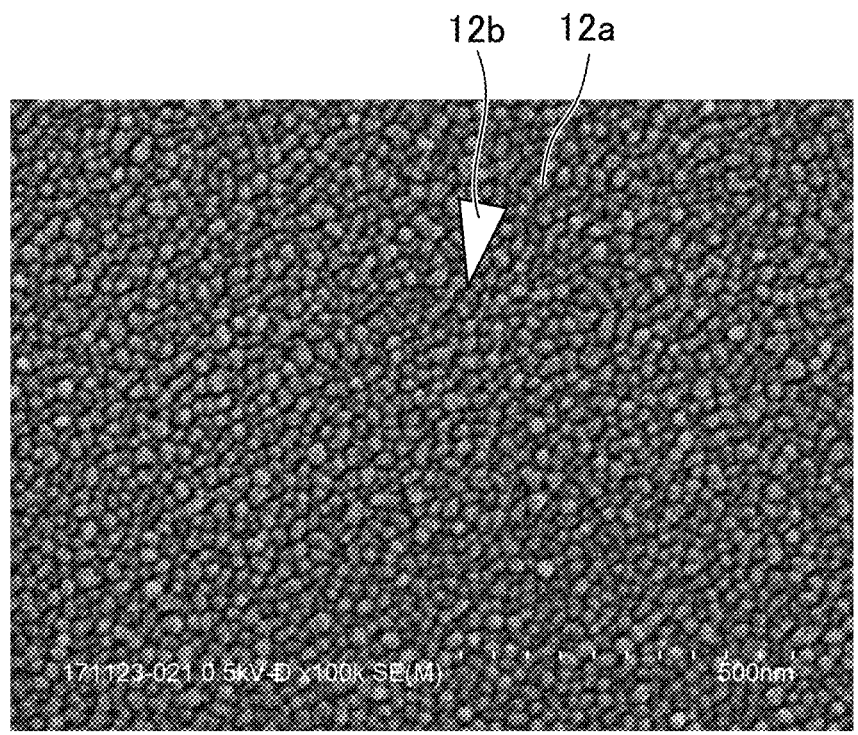
FIGS. 2A and 2B are electron microscope photographs each showing a surface of a metallic lustrous member with radio wave transmissibility according to one embodiment of the present invention.
Figure 2B:
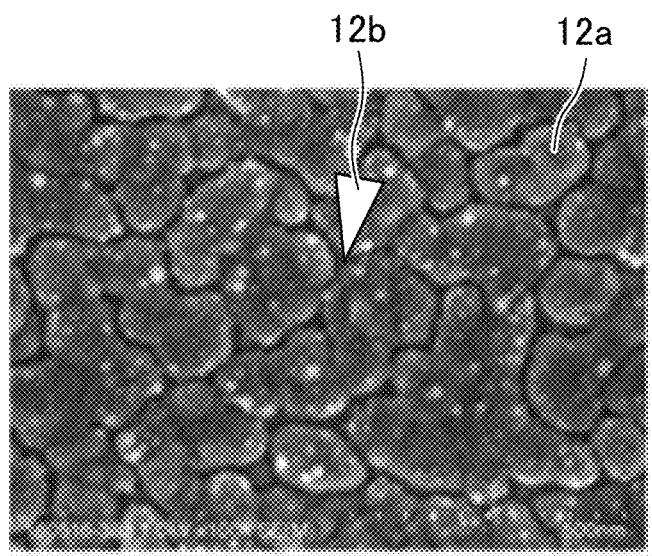
Figure 3:
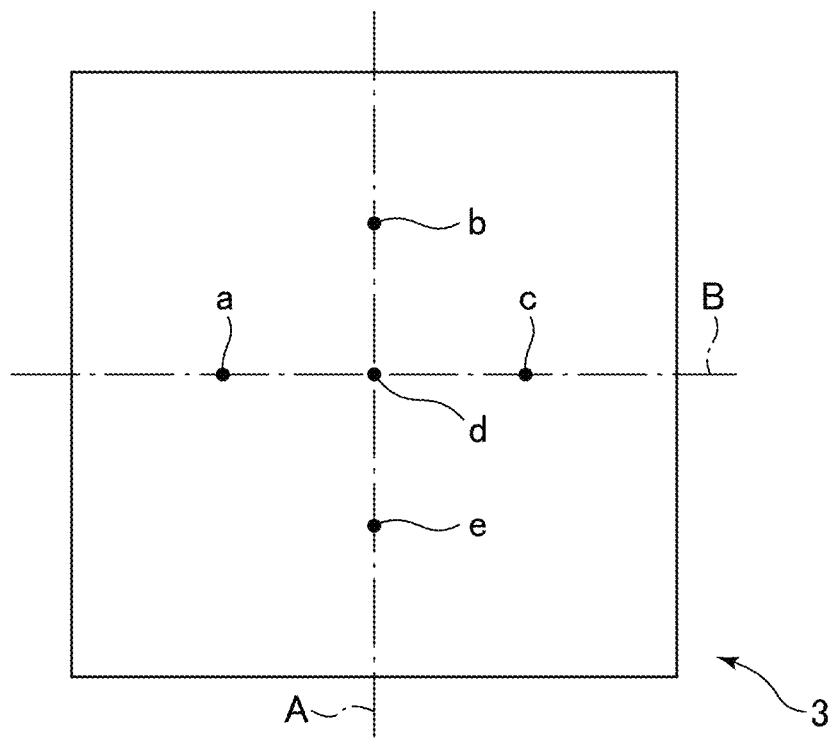
FIG. 3 is a diagram for explaining a method of measuring the thickness of a metal layer in each of Inventive and Comparative Examples.

FIGS. 2A and 2B are electron microscope photographs (SEM images) each showing a surface of a metallic lustrous member with radio wave transmissibility. Here, an image size of the SEM image in FIG. 2A is 1.16 μm×0.85 μm, and an image size of the SEM image in FIG. 2B is 1.16 μm×0.85 μm. When determining the maximum thickness, a 5 cm-square region 3 as shown in FIG. 3 was appropriately extracted from the metal layer appearing on the surface of the metallic lustrous member as shown in each of FIGS. 2A and 2B, and then total five points "a" to "e" which are obtainable by dividing each of two center lines A, B of horizontal sides and the vertical sides of the square region 3 equally into four parts, are selected as measurement points.

Figure 4:
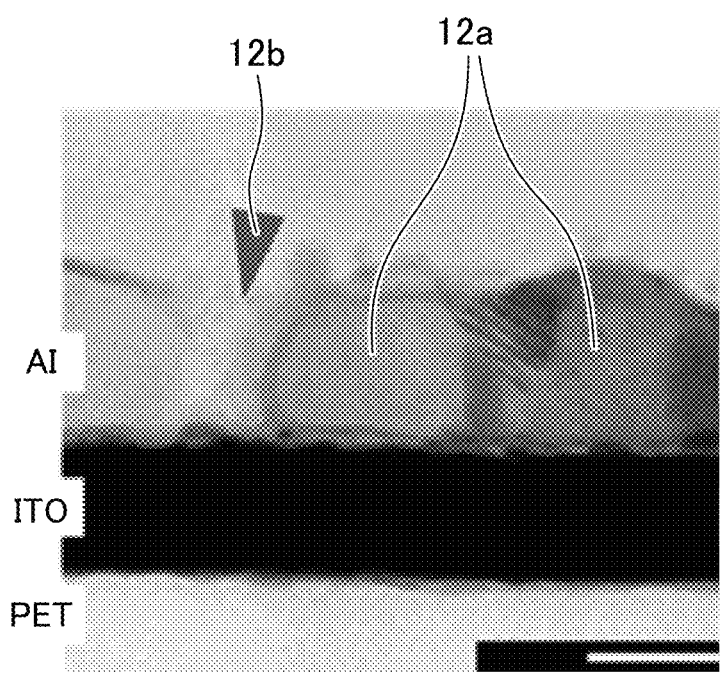
FIG. 4 is an image of a cut surface in a partial region of FIG. 2B.

Subsequently, in a cross-sectional image (transmission electron microscopic photogram (TEM image)) as shown in FIG. 4, at each of the selected measurement points, a view-angle region including about five separated segments $12a$ was extracted.

Subsequently, respective thicknesses of the about five separated segments $12a$ in each of the five measurement points, i.e., about twenty-five (five segments×five points) separated segments $12a$, are determined, and an average of the thicknesses of them was used as the "maximum thickness".

Results of the evaluations are shown in the following Table 1.

TABLE 1

| | Metal Layer | | Sputtering Conditions | | | | Radio Wave Transmissibility | | | Lustrousness | | |
| --- | --- | --- | --- | --- | --- | --- | --- | --- | --- | --- | --- | --- |
| | | | | | | | | Radio Wave Transmission | | Gloss | | |
| | | | | | | | Sheet | Attenuation | | | | |
| | Material | Maximum Thickness (nm) | Film Forming Method | Substrate Temperature (° C.) | Ar Gas Pressure (Pa) | Substrate Film Material | Resistance [Ω/□] | Amount @ 1 GHz [−dB] | Evaluation | Value GS20° [-] | Evaluation | Comprehensive Evaluation |
| Inventive Example 1 | Al | 20 | MF-AC sputtering | 130 | 2 | PET | >3K | 0.02 | ◎ | 601 | Δ | ○ |
| Inventive Example 2 | Al | 30 | MF-AC sputtering | 130 | 2 | PET | >3K | 0.02 | ◎ | 750 | Δ | ○ |
| Inventive Example 3 | Al | 40 | MF-AC sputtering | 130 | 2 | PET | >3K | 0.03 | ◎ | 825 | ○ | ○ |
| Inventive Example 4 | Al | 50 | MF-AC sputtering | 130 | 3 | PET | >3K | 0.05 | ◎ | 915 | ○ | ○ |
| Inventive Example 5 | Al | 60 | MF-AC sputtering | 130 | 3 | PET | 320 | 3.7 | ○ | 1020 | ◎ | ○ |
| Inventive Example 6 | Al | 70 | MF-AC sputtering | 130 | 3 | PET | 180 | 5.4 | Δ | 1130 | ◎ | ○ |
| Inventive Example 7 | Al | 30 | MF-AC sputtering | 25 | 2 | PET | >3K | 0.3 | ◎ | 920 | ○ | ○ |
| Inventive Example 8 | Al | 30 | MF-AC sputtering | 25 | 2 | PMMA | >3K | 0.2 | ◎ | 892 | ○ | ○ |
| Inventive Example 9 | Al | 30 | MF-AC sputtering | 25 | 2 | PC | >3K | 0.3 | ◎ | 930 | ○ | ○ |
| Inventive Example 10 | Al | 30 | MF-AC sputtering | 25 | 2 | Glass | >3K | 0.3 | ◎ | 1104 | ◎ | ○ |

TABLE 1-continued

| | Metal Layer | | Sputtering Conditions | | | | Radio Wave Transmissibility | | | Lustrousness | | |
| --- | --- | --- | --- | --- | --- | --- | --- | --- | --- | --- | --- | --- |
| | | | | | | | Sheet | Radio Wave Transmission Attenuation | | Gloss | | |
| | Material | Maximum Thickness (nm) | Film Forming Method | Substrate Temperature (° C.) | Ar Gas Pressure (Pa) | Substrate Film Material | Resis-tance [Ω/□] | Amount @ 1 GHz [−dB] | Evaluation | Value GS20° [-] | Evaluation | Compre-hensive Evaluation |
| Inventive Example 11 | Al | 30 | MF-AC sputtering | 25 | 2 | ITO/PET | >3K | 0.03 | ⊚ | 763 | ○ | ○ |
| Comparative Example 1 | Al | 10 | MF-AC sputtering | 130 | 1 | PET | >3K | 0.02 | ⊚ | 307 | X | X |
| Comparative Example 2 | Al | 100 | MF-AC sputtering | 130 | 1 | PET | 0.6 | 45.1 | X | 1850 | ⊚ | X |
| Comparative Example 3 | Al | 30 | DC sputtering | 130 | 1 | PET | 1.3 | 40.2 | X | 1632 | ⊚ | X |
| Comparative Example 4 | Al | 30 | Vacuum deposition | 25 | 0.0001 | PET | 2.4 | 35.6 | X | 1570 | ⊚ | X |

Inventive Example 1

A PET film manufactured by Mitsubishi Plastics, Inc. (thickness: 125 μm) was used as a film serving as the substrate 10 (hereinafter referred to as "substrate film"). Further, an aluminum layer was used as the metal layer. An aluminum (Al) layer having a maximum thickness of 20 nm was formed directly on a continuous surface of the substrate film, by means of AC sputtering (MF-AC sputtering using an intermediate frequency range of 40 kHz), to obtain a metallic lustrous member (hereinafter referred to as "metal film"). The temperature of the substrate film during formation of the Al layer was set at 130° C., and the pressure of argon (Ar) gas in a chamber for receiving therein the substrate film was set to 2 Pa.

In the metal film of Inventive Example 1, the continuous surface of the substrate film exhibits high smoothness and corrosion resistance, and, on the other hand, the aluminum layer on this continuous surface includes a plurality of separated segments 12a formed in a discontinuous state. Thus, the sheet resistance of the aluminum layer had a large value, and, in terms of the radio wave transmission attenuation amount, a relatively good result was shown. In Table 1, for the sake of simplicity, with regard to a result of "evaluation" of the radio wave transmission attenuation amount, when a sample had a radio wave transmission attenuation amount of less than 2 [− dB], the sample was evaluated as "⊚", and, when a sample had a radio wave transmission attenuation amount of 2 [− dB] to less than 5 [− dB], the sample was evaluated as "○". Further, when a sample had a radio wave transmission attenuation amount of 5 [− dB] to less than 10 [− dB], the sample was evaluated as "Δ", and, when a sample had a radio wave transmission attenuation amount of 10 [− dB] or more, the sample was evaluated as "x".

Further, in the metal film of Inventive Example 1, in terms of the lustrousness, a result ensuring sufficient practicality was also obtained. In Table 1, for the sake of simplicity, with regard to a result of "evaluation" of the gloss value, when a sample has a gloss value of 1000 or more, the sample was evaluated as "⊚", and, when a sample had a lustrousness of 750 to less than 1000, the sample was evaluated as "○". Further, when a sample had a lustrousness of 500 to less than 750, the sample was evaluated as "Δ", and, when a sample had a lustrousness of less than 500, the sample was evaluated a "x". Further, with regard to "comprehensive evaluation" of the radio wave transmissibility and the lustrousness, when a sample was evaluated as "x" in any of the evaluations, the sample was comprehensively evaluated as "x", and, in any other case, a sample was comprehensively evaluated as "○". As a result, in Inventive Example 1, the comprehensive evaluation was "○", i.e., a good metallic lustrous member or metal film having both the radio wave transmissibility and the lustrousness could be obtained.

Inventive Examples 2 to 6

In Inventive Examples 2 to 6, the maximum thickness of the aluminum layer formed on the continuous surface of the substrate film was increased in a stepwise manner, such that it becomes greater than that in Inventive Example 1. Further, in Inventive Examples 4 to 6, the pressure of the argon gas was set to a larger value than that in Inventive Example 1. The remaining conditions were the same as those in Inventive Example 1.

With regard to the sheet resistance, in Inventive Examples 2 to 4, a large value of greater than 3 kΩ was obtained, as with Inventive Example 1. On the other hand, in Inventive Examples 5 and 6, a practically sufficiently large value was obtained although it is not as high as those in Inventive Examples 2 to 4. The reason why the sheet resistance in Inventive Examples 5 and 6 becomes lower than that in Inventive Example 1 is considered that the amount of deposition of aluminum is excessively increased, thereby causing a decrease in the discontinuous region. With regard to the radio wave transmissibility, in all of Inventive Examples 2 to 6, results equivalent to or better than that in Inventive Example 1 were obtained. Further, with regard to the gloss value, in all of Inventive Examples 2 to 6, results better than that in Inventive Example 1 were of course obtained.

FIG. 2A shows an SEM image of the surface of the metallic lustrous member (metal film) obtained in Inventive Example 6.

Inventive Examples 7 to 11

In all of Inventive Examples 7 to 11, the maximum thickness of the aluminum layer formed on the continuous surface was set to be equal to that in Inventive Example 2, and sputtering conditions, except for the temperature of the substrate film, were set in the same manner as those in Inventive Example 2. Specifically, the temperature of the substrate film was set to be lower than that in Inventive Example 2. Among Inventive Examples 7 to 11, a material for the substrate film was changed. Specifically, polyethylene terephthalate (a PET film manufactured by Mitsubishi Chemical Co., thickness: 125 μm) was used in Inventive Example 7; polymethylmethacrylate (PMMA manufactured by Mitsubishi Chemical Corporation., thickness: 125 μm) was used in Inventive Example 8; polycarbonate (PC manufactured by Sumitomo Chemical Co., Ltd., thickness: 125 μm) was used in Inventive Example 9; alkali-free glass (manufactured by Corning Inc., thickness: 400 μm) was used in Inventive Example 10; and ITO/PET (in which the content rate by weight of tin (Sn) with respect to $In_2O_3$ in ITO is 10 wt %, and the film thickness is 5 nm) was used in Inventive Example 11. Although a material for the substrate film was changed among Inventive Examples 7 to 11 in this manner, both the radio wave transmissibility and the lustrousness in all of them were equivalent to or better than those in Inventive Examples 1 to 6. From the results of Inventive Examples 7 to 11, it is evident that a metallic lustrous member or metal film having both the radio wave transmissibility and the lustrousness can be obtained, irrespective of a material for the substrate film.

Comparative Examples 1 and 2

In Comparative Example 1, the maximum thickness of the aluminum layer formed on the continuous layer of the substrate film was reduced to a smaller value than those in Inventive Examples 1 to 11. On the other hand, in Comparative Example 2, the maximum thickness was increased to a larger value than those in Inventive Examples 1 to 11. Further, In Comparative Examples 1 and 2, the pressure of the argon gas was set to a lower value than those in Inventive Examples 1 to 11. The remaining conditions were the same as those in Inventive Examples 1 to 6.

In Comparative Example 1, a good result was obtained in terms of the sheet resistance and the radio wave transmissibility because of the relatively small thickness of the aluminum layer, but an insufficient result was obtained in terms of the lustrous character. On the other hand, in Comparative Example 2, a sufficient result was obtained in terms of the lustrous character because of the relatively large thickness of the aluminum layer, but values of the sheet resistance and the radio wave transmissibility became worse and could not reach a level ensuring practicality.

Comparative Example 3

Conditions, except for the method for sputtering and the pressure of the argon gas, were the same as those in Inventive Example 2. Specifically, the pressure of the argon gas was set to a lower value than those in Inventive Examples 1 to 11, as with Comparative Examples 1 and 2. Further, DC sputtering was used here as the method for sputtering. A DC sputtering apparatus was prepared by using the same apparatus as that in Inventive Example 1, and changing only a power supply to a DC system. As a result of the measurement, in terms of each of the radio wave transmissibility and the lustrousness, a sufficient result was obtained.

Comparative Example 4

Vacuum deposition was used here as the film forming method. More specifically, a high-vacuum deposition apparatus EX-550 manufactured by ULVAC, Inc., was used, and a substrate was set inside a chamber thereof. After evacuating the chamber to a pressure of $10^{-4}$ Pa, an aluminum film was formed by a resistance heating deposition method at a deposition rate of 1 nm/sec to have a thickness of 30 nm. As a result of the measurement, in terms of each of the radio wave transmissibility and the lustrousness, an insufficient result was obtained.

<5-2. Case where Continuous Surface is Formed by Underlying Layer>

In Inventive and Comparative Examples, various samples were prepared by using a film as the substrate 10. Each of the prepared samples was evaluated in terms of the sheet resistance, the radio wave transmission attenuation amount, and visible light reflectance. Here, the sheet resistance and the radio wave transmission attenuation amount are evaluation indexes of the radio wave transmissibility, and the visible light reflectance is an evaluation index of the lustrousness. A larger value of each of the visible light reflectance and the sheet resistance is more desirable, and a smaller value of the radio wave transmission attenuation amount is more desirable.

Details of evaluation methods are as follows.

(1) Sheet Resistance

The sheet resistance was measured in a similar manner to that in the sub-sub-section 5-1-(1).

This sheet resistance needs to be equal to or greater than 90Ω/□, wherein it is preferably equal to or greater than 200Ω/□, more preferably equal to or greater than 250Ω/□, further preferably equal to or greater than 600Ω/□. If the sheet resistance is less than 90Ω/□, there is a problem that a sufficient radio wave transmissibility cannot be obtained.

(2) Radio Wave Transmission Attenuation Amount

The radio wave transmission attenuation amount was measured and evaluated in a similar manner to that in the sub-sub-section 5-1-(2). More specifically, an electromagnetic wave transmissibility in a frequency band (76 to 80 GHz) of a millimeter-wave radar is correlated with an electromagnetic wave transmissibility in a microwave band (1 GHz), and thus they exhibit relatively close values. Thus, in this evaluation, the radio wave transmissibility in the microwave band (1 GHz), i.e., microwave electric field transmission attenuation amount, was used as an index.

This microwave electric field transmission attenuation amount needs to be equal to or less than 10 [− dB], wherein it is preferably equal to or less than 5 [− dB], more preferably equal to or less than 2 [− dB]. If the microwave electric field transmission attenuation amount is greater than 10 [− dB], there is a problem that 90% or more of a radio wave is shielded.

(3) Visible Light Reflectance

A reflectance at a measurement wavelength of 550 nm was measured using a spectrophotometer U4100 manufactured by Hitachi High Technologies Co., Ltd. As a reference value, the reflectance of an Al-deposited mirror was defined as a reflectance of 100%. In order to have a sufficient lustrousness, the visible light reflectance need to be equal to or greater than 20%, wherein it is preferably equal to or greater than 40%, more preferably equal to or greater than 50%. If the visible light reflectance is less than 20%, there is a problem that the lustrousness significantly deteriorates, resulting in failing to ensure excellent external appearance.

(4) Thickness of Metal Layer

The thickness of the metal layer was measured as "maximum thickness" in a similar manner to that in the sub-sub-section 5-1-(4).

Results of the evaluations are shown in the following Table 2.

TABLE 2

| | Metal Layer | | Underlying Layer | | Sheet Resistance [Ω/□] | Radio Wave Transmissibility | | Lustrousness | | Comprehensive Evaluation |
|---|---|---|---|---|---|---|---|---|---|---|
| | | | | | | Radio Wave Transmission Attenuation Amount @ 1 GHz [−dB] | Evaluation | Visible Light Reflectance @ 550 n [%] | Evaluation | |
| | Material | Thickness (nm) | Material | Thickness (nm) | | | | | | |
| Inventive Example 12 | Al | 50 | ITO(Sn + In₂O₃) Sn10% | 50 | 260 | 4.5 | ○ | 56 | ◎ | ○ |
| Inventive Example 13 | Al | 30 | ITO(Sn + In₂O₃) Sn10% | 50 | 257 | 4.5 | ○ | 38 | Δ | Δ |
| Inventive Example 14 | Al | 40 | ITO(Sn + In₂O₃) Sn10% | 50 | 258 | 4.5 | ○ | 48 | ○ | ○ |
| Inventive Example 15 | Al | 65 | ITO(Sn + In₂O₃) Sn10% | 50 | 250 | 4.6 | ○ | 71 | ◎ | ○ |
| Inventive Example 16 | Al | 50 | ITO(Sn + In₂O₃) Sn10% | 30 | 613 | 2.1 | ○ | 55 | ◎ | ○ |
| Inventive Example 17 | Al | 50 | ITO(Sn + In₂O₃) Sn10% | 20 | 1303 | 1.1 | ◎ | 56 | ◎ | ◎ |
| Inventive Example 18 | Al | 50 | ITO(Sn + In₂O₃) Sn10% | 10 | 2450 | 0.3 | ◎ | 56 | ◎ | ◎ |
| Inventive Example 19 | Al | 50 | ITO(Sn + In₂O₃) Sn10% | 5 | 4830 | 0.02 | ◎ | 55 | ◎ | ◎ |
| Inventive Example 20 | Al | 50 | ITO(Sn + In₂O₃) Sn30% | 50 | 320 | 3.8 | ○ | 56 | ◎ | ○ |
| Inventive Example 21 | Al | 50 | ITO(Sn + In₂O₃) Sn7.5% | 50 | 300 | 4.0 | ○ | 56 | ◎ | ○ |
| Inventive Example 22 | Al | 50 | ITO(Sn + In₂O₃) Sn2.5% | 50 | 245 | 4.8 | ○ | 56 | ◎ | ○ |
| Inventive Example 23 | Al | 40 | In₂O₃ | 50 | 170 | 6.0 | Δ | 47 | ○ | Δ |
| Inventive Example 24 | Al | 50 | IZO(In₂O₃ + ZnO) | 50 | 92 | 9.6 | Δ | 55 | ◎ | Δ |
| Comparative Example 5 | Al | 110 | ITO(Sn + In₂O₃) Sn10% | 50 | 0.6 | 45.1 | X | 78 | ◎ | X |
| Comparative Example 6 | Al | 50 | None | — | 2.2 | 36.8 | X | 73 | ◎ | X |

Inventive Example 12

A PET film (thickness: 125 μm) manufactured by Mitsubishi Plastics, Inc. was used as the substrate film First of all, using DC magnetron sputtering, a 50 nm-thick ITO layer was formed directly on a surface of the substrate film to extend along the surface of the substrate film. The temperature of the substrate film during formation of the ITO layer was set at 130° C. The ITO is a composition obtained by adding Sn to In₂O₃ in an amount of 10 wt %.

Subsequently, using AC sputtering (MF-AC sputtering using an intermediate frequency range of 40 kHz), an aluminum (Al) layer having a maximum thickness of 50 nm was formed on the ITO layer to obtain a metallic lustrous member (metal film). The temperature of the substrate film during formation of the Al layer was set at 130° C., and the pressure of argon (Ar) gas in a chamber for receiving therein the substrate film was set to 0.22 Pa.

FIG. 2B is an SEM image of the surface of the metallic lustrous member (metal film) obtained as a result of the above process, and FIG. 4 is an image of a cut surface in a partial region of FIG. 2B. An image size of the SEM image in FIG. 2B is 1.16 μm×0.85 μm. It can be considered that a similar cut surface to that in FIG. 4 is obtained in each of Inventive Examples 1 to 11.

As is evident from these figures, in Inventive Example 12, since the ITO layer is provided along the surface of the substrate film in a continuous state, it exhibits high smoothness and corrosion resistance, and, on the other hand, the aluminum layer laminated on the ITO layer includes a plurality of separated segments 12a formed in a discontinuous state, so that the sheet resistance was 260Ω/□, and the radio wave transmission attenuation amount at a wavelength of 1 GHz was 4.5 [− dB], i.e., in terms of the radio wave transmissibility, a good result could be obtained. In Table 1, for the sake of simplicity, with regard to a result of "evaluation" of the radio wave transmission attenuation amount, when a sample had a radio wave transmission attenuation amount of less than 2 [− dB], the sample was evaluated as "⊚", and, when a sample had a radio wave transmission attenuation amount of 2 [− dB] to less than 5 [− dB], the sample was evaluated as "◯". Further, when a sample had a radio wave transmission attenuation amount of 5 [− dB] to less than 10 [− dB], the sample was evaluated as "Δ", and, when a sample had a radio wave transmission attenuation amount of 10 [− dB] or more, the sample was evaluated as "x".

Further, the visible light reflectance of this metallic lustrous member was 56%, i.e., in terms of the visible light reflectance, a good result could be obtained. In Table 1, for the sake of simplicity, with regard to a result of "evaluation" of the visible light reflectance, when a sample has a visible light reflectance of greater than 50%, the sample was evaluated as "⊚", and, when a sample had a visible light reflectance of greater than 40% to 50%, the sample was evaluated as "◯". Further, when a sample had a visible light reflectance of greater than 20% to 40%, the sample was evaluated as "Δ", and, when a sample had a visible light reflectance of 20% or less, the sample was evaluated as "x". Further, with regard to "comprehensive evaluation" of the radio wave transmissibility and the lustrousness, when the two properties have the same evaluation, the same evaluation is indicated in the field, and, when the evaluation of one of the properties is worse than that of the other property, the worse evaluation is indicated in the field. As a result, in Inventive Example 11, the comprehensive evaluation was "◯", i.e., a good metallic lustrous member or metal film having both the radio wave transmissibility and the lustrousness could be obtained.

Inventive Examples 13 to 15

In Inventive Examples 13 and 14, the maximum thickness of the aluminum layer laminated on the ITO layer was changed to a smaller value than that in Inventive Example 12. On the other hand, in Inventive Example 15, the thickness was changed to a larger value than that in Inventive Example 12. The remaining conditions were the same as those in Inventive Example 12.

As a result of the measurements, with regard to the sheet resistance and the radio wave transmission attenuation amount, similar values and evaluations to those in Inventive Example 12 could be obtained in each of Inventive Examples 13 to 15. On the other hand, with regard to the visible light reflectance, in each of Inventive Examples 13 and 14 in which the maximum thickness of the aluminum layer is smaller than that in Inventive Example 12, a slightly inferior result was obtained, whereas, in Inventive Example 15, a better result than that in Inventive Example 12 could be obtained. However, even in Inventive Examples 13 and 14, it is possible to ensure sufficient practicality.

Inventive Examples 16 and 17

The thickness of the ITO layer was set to a smaller value than that in Inventive Example 12. The remaining conditions were the same as those in Inventive Example 12.

As a result of the measurements, with regard to the sheet resistance and the radio wave transmission attenuation amount, better results than those in Inventive Example 12 could be obtained in each of Inventive Examples 16 to 19. Further, with regard to the visible light reflectance, a similar value and evaluation to those in Inventive Example 12 could be obtained in each of Inventive Examples 16 to 19. From these Inventive Examples, it has become evident that the thickness of the ITO layer may be reduced, i.e., that a material cost can be reduced by reducing the thickness of the ITO layer.

Inventive Examples 20 to 23

In Inventive Example 20, the content rate of Sn in the ITO layer was changed to a larger value than that in Inventive Example 12. On the other hand, in Inventive Examples 21 to 23, the content rate was changed to a smaller value than that in Inventive Example 12. Here, in Inventive Example 23, the content rate of Sn in the ITO layer is set to zero. Thus, to be exact, this layer is not an ITO layer but an indium oxide ($In_2O_3$) layer. Further, in Inventive Example 23, the thickness of the aluminum layer was set to 40 nm. The remaining conditions were the same as those in Inventive Example 12.

As a result of the measurements, with regard to the sheet resistance and the radio wave transmission attenuation amount, similar results to those in Inventive Example 12 could be obtained in each of Inventive Examples 20 to 22, and results in Inventive Example 23 were slightly inferior to those in Inventive Example 12. On the other hand, with regard to the visible light reflectance, in each of Inventive Examples 20 to 22, a similar value and evaluation to those in Inventive Example 12 could be obtained, whereas a result in Inventive Example 23 was slightly inferior to that in Inventive Example 12. From these results, it has become evident that the ITO layer preferable contains Sn.

Inventive Example 24

As a material for the indium oxide-containing layer, IZO obtained by adding ZnO to indium oxide was used, instead of ITO. ZnO is added to $In_2O_3$ in an amount of 11 wt %. The remaining conditions were the same as those in Inventive Example 12.

As a result of the measurements, with regard to the sheet resistance and the radio wave transmission attenuation amount, results in Inventive Example 24 were slightly inferior to those in Inventive Example 12. On the other hand, with regard to the visible light reflectance, a similar value and evaluation to those in Inventive Example 12 could be obtained. It has become evident that, even using IZO to which ZnO is added, sufficient practicality can be ensured, although the comprehensive evaluation in Inventive Example 24 is inferior to that in Inventive Example 12.

Comparative Example 5

The maximum thickness of the aluminum layer laminated on the ITO layer was changed to a larger value than that in Inventive Example 12. The remaining conditions were the same as those in Inventive Example 12.

As a result of the measurements, with regard to the visible light reflectance, due to the increase in thickness, a better result than that in Inventive Example 11 could be obtained. On the other hand, with regard to the sheet resistance and the radio wave transmission attenuation amount, results in Comparative Example 5 were significantly inferior to those in Inventive Example 12, and evaluated as impractical.

Comparative Example 6

The aluminum layer was formed directly on the substrate film without providing any ITO layer. The remaining conditions were the same as those in Inventive Example 12.

As a result of the measurements, with regard to the visible light reflectance, a similar value and evaluation to those in Inventive Example 12 could be obtained. On the other hand, with regard to the sheet resistance and the radio wave transmission attenuation amount, results in Comparative Example 6 were significantly inferior to those in Inventive Example 12, and evaluated as impractical.

<6. Utilization of Metal Thin Film>

The metal layer 12 formed in the metallic lustrous member 1A has a small thickness of about 20 to 100 nm, and can be used by itself as a metal thin film. For example, the metal layer 12 may be formed by sputtering on the indium oxide-containing layer 11 laminated on a substrate such as the substrate 10, to obtain a film. Further, separately from this, an adhesive is applied onto a substrate to produce an adhesive layer-attached substrate. Then, the film is laminated to the adhesive layer-attached substrate, such that the metal layer 12 comes in contact with the adhesive layer. In this way, the metal layer (metal thin film) 12 which has been located on the outermost surface side of the film can be transferred to the outermost surface side of the adhesive layer-attached substrate, by separating the film and the substrate from each other, after fully having contacted them.

It is to be understood that the present invention is not limited to the above embodiment and the examples, but various changes and modifications may be made therein without departing from the spirit and scope thereof as set forth in appended claims.

INDUSTRIAL APPLICABILITY

The metal film or the metallic lustrous member according to the present invention can be suitably used, e.g., to decorate a cover member of a millimeter-wave radar mounted to a front component such as a front grille or an emblem at a front end of an automotive vehicle. Further, the present invention may also be applied to various other articles requiring both an aesthetic quality and radio wave transmissibility, such as a mobile phone, a smart phone, a tablet PC, a notebook PC, and a refrigerator.

LIST OF REFERENCE SIGNS

1: metallic lustrous member
3: metal film
10: substrate film
10a: continuous surface
11: underlying layer (indium oxide-containing layer)
1a: continuous surface
12: metal layer

The invention claimed is:

1. A metallic lustrous member with radio wave transmissibility, comprising:
   a substrate having radio wave transmissibility;
   a continuous indium oxide-containing layer on a surface of the substrate; and
   an aluminum layer formed directly on the continuous indium oxide-containing layer on the surface of the substrate wherein
   the aluminum layer is formed by alternating current (AC) sputtering and has a discontinuous region including that includes a plurality of separated segments which are in a discontinuous state on the continuous indium oxide-containing layer, and
   the aluminum layer has a radio wave transmission attenuation amount of 10 dB or less.

2. The metallic lustrous member as recited in claim 1, wherein the aluminum layer has a sheet resistance of 90Ω/☐ or more.

3. The metallic lustrous member as recited in claim 1, wherein the substrate is one selected from the group consisting of a film, a resin molded product, a glass product, and an article itself to be imparted with metallic luster.

4. The metallic lustrous member as recited in claim 1, wherein the aluminum layer has a maximum thickness of 15 to 80 nm.

5. The metallic lustrous member as recited in claim 1, wherein the aluminum layer is one of aluminum (Al) and an aluminum (Al) alloy.

6. The metallic lustrous member as recited in claim 5, wherein a content ratio of aluminum to an entire metal component in the aluminum (Al) alloy is 50% or more.

7. The metallic lustrous member as recited in claim 1, wherein the aluminum layer is provided on an inner surface of a transparent housing formed using the continuous surface of the substrate.

8. An article using the metallic lustrous member as recited in claim 1.

9. The article as recited in claim 8, which is a communication device.

10. A production method for a metallic lustrous member with radio wave transmissibility, or an article using the metallic lustrous member, the method comprising:
    forming a continuous indium oxide-containing layer on a surface of a substrate having radio wave transmissibility;
    forming an aluminum layer directly on the continuous indium oxide-containing layer on the surface of the substrate by alternating current (AC) sputtering,
    wherein the aluminum layer is formed having a discontinuous region that includes a plurality of separated segments which are in a discontinuous state on the continuous indium oxide-containing layer, and wherein the aluminum layer has radio wave transmission attenuation amount of 10 dB or less.

11. The production method as recited in claim 10, wherein the AC sputtering is performed under a pressure of 1.5 Pa or more.

12. The production method as recited in claim 10, wherein, during the AC sputtering, the substrate has a temperature of 20° C. or more.

* * * * *